United States Patent
Sudo et al.

(10) Patent No.: US 7,880,214 B2
(45) Date of Patent: Feb. 1, 2011

(54) NONVOLATILE SEMICONDUCTOR DEVICE

(75) Inventors: Naoaki Sudo, Kanagawa (JP); Kohji Kanamori, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 61 days.

(21) Appl. No.: 11/431,569

(22) Filed: May 11, 2006

(65) Prior Publication Data

US 2006/0261400 A1    Nov. 23, 2006

(30) Foreign Application Priority Data

May 17, 2005    (JP)    ............................. 2005-144356

(51) Int. Cl.
*H01L 29/76*    (2006.01)
(52) U.S. Cl. ............................. 257/314; 257/E21.179
(58) Field of Classification Search .................. 257/202, 257/314, E21.179
See application file for complete search history.

(56) References Cited

U.S. PATENT DOCUMENTS

| | | | |
|---|---|---|---|
| 5,946,240 A | 8/1999 | Hisamune | |
| 6,373,094 B2 * | 4/2002 | Marshall et al. | ............. 257/315 |
| 2003/0146465 A1 * | 8/2003 | Wu | ............................ 257/314 |

FOREIGN PATENT DOCUMENTS

| | | |
|---|---|---|
| JP | 4-278289 | 10/1992 |
| JP | 4-318392 | 11/1992 |
| JP | 2000-150823 | 5/2000 |
| JP | 2001-28428 | 1/2001 |
| JP | 3249811 | 11/2001 |
| JP | 2005-109213 | 4/2005 |

OTHER PUBLICATIONS

Chinese Office Action dated Mar. 20, 2009 (with partial English translation).
Notice of the Grounds for Rejection dated Sep. 7, 2010 (with partial English translation).

* cited by examiner

*Primary Examiner*—Bradley K Smith
*Assistant Examiner*—Amar Movva
(74) *Attorney, Agent, or Firm*—McGinn IP Law Group, PLLC

(57) ABSTRACT

A nonvolatile semiconductor storage device in which one unit cell comprises a select gate 3 (3*a*-3*i*) provided in a first region on a substrate 1; a floating gate 6 provided in a second region adjacent to the first region; a diffused region 7*b* adjacent to the second region and provided in a third region on the surface of the substrate 1; and a control gate 11 provided on the floating gate 6. The select gate 3 is divided into three or more in an erase block 23 composed of all unit cells, from each of which electrons are extracted from the floating gate, at the same time when an erase operation is performed. Each of the select gates 3*a*-3*i*, created by the division, is formed in a comb-like shape in which, when viewed from the direction of a normal line to a plane, a plurality of comb teeth extend from a common line. The comb teeth of a select gate (for example, 3*b*) are arranged in gaps between the comb teeth of an adjacent select gate (for example, 3*a*, 3*c*) at a predetermined spacing.

3 Claims, 11 Drawing Sheets

NONVOLATILE SEMICONDUCTOR DEVICE

FIELD OF THE INVENTION

The present invention relates to a nonvolatile semiconductor device having cell transistors, and more particularly to a nonvolatile semiconductor storage device from which data can be read quickly.

BACKGROUND OF THE INVENTION

Figure 6:
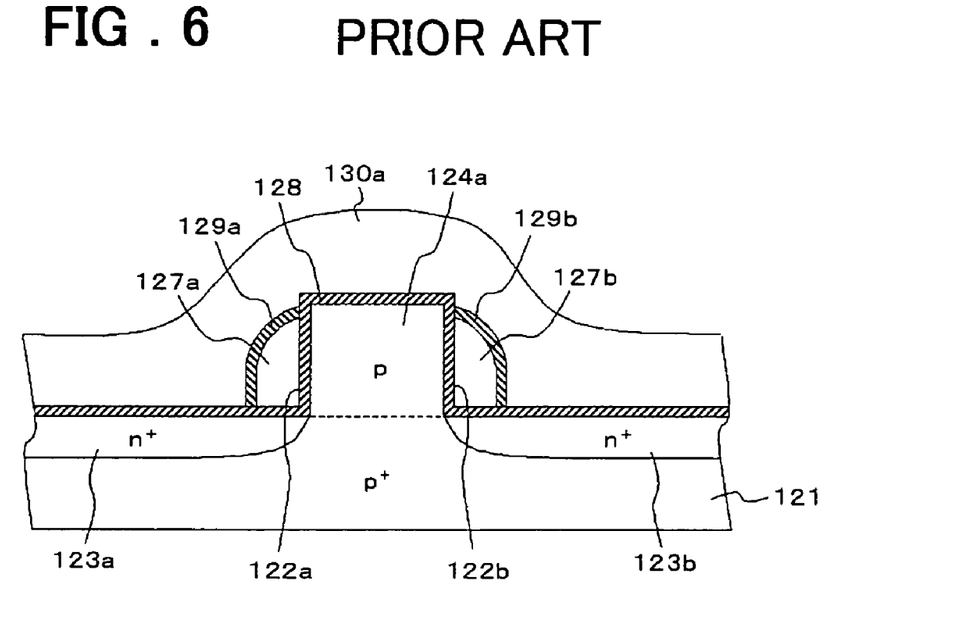
FIG. 6 is a partial cross section view schematically showing the configuration of a semiconductor storage device in prior art 1.

Among conventional semiconductor storage devices, a nonvolatile semiconductor storage device having a cell transistor, such as that shown in FIG. 6, is known as a nonvolatile semiconductor storage device for storing multiple bits of information in one cell (prior art 1). A nonvolatile semiconductor storage device according to prior art 1 comprises two first-conductive-type, strip-shaped regions 123a and 123b formed on the surface layer of a semiconductor substrate 121 across a second-conductive-type, strip-shaped semiconductor layer 124a; a first floating gate 127a extending from one of the first-conductive-type regions 123a to one of the sides of the semiconductor layer 124a via an insulator film 122a; a second floating gate 127b extending from the other of the first-conductive-type regions 123b to the other of the sides of the semiconductor layer 124a via an insulator film 122b; and a control gate 130a formed on the top surface of the semiconductor layer 124a via an insulator film 128 (see Patent Document 1). The nonvolatile semiconductor storage device according to prior art 1 has a reliable structure, maintains the localization of trapped charges even if an excessive amount of data is written, and reduces the variation in threshold voltages. In addition, the structure, in which the floating gates 127a and 127b are laid on the regions 123a and 123b of the first conductive type respectively, makes size-reduction possible.

Figure 7:
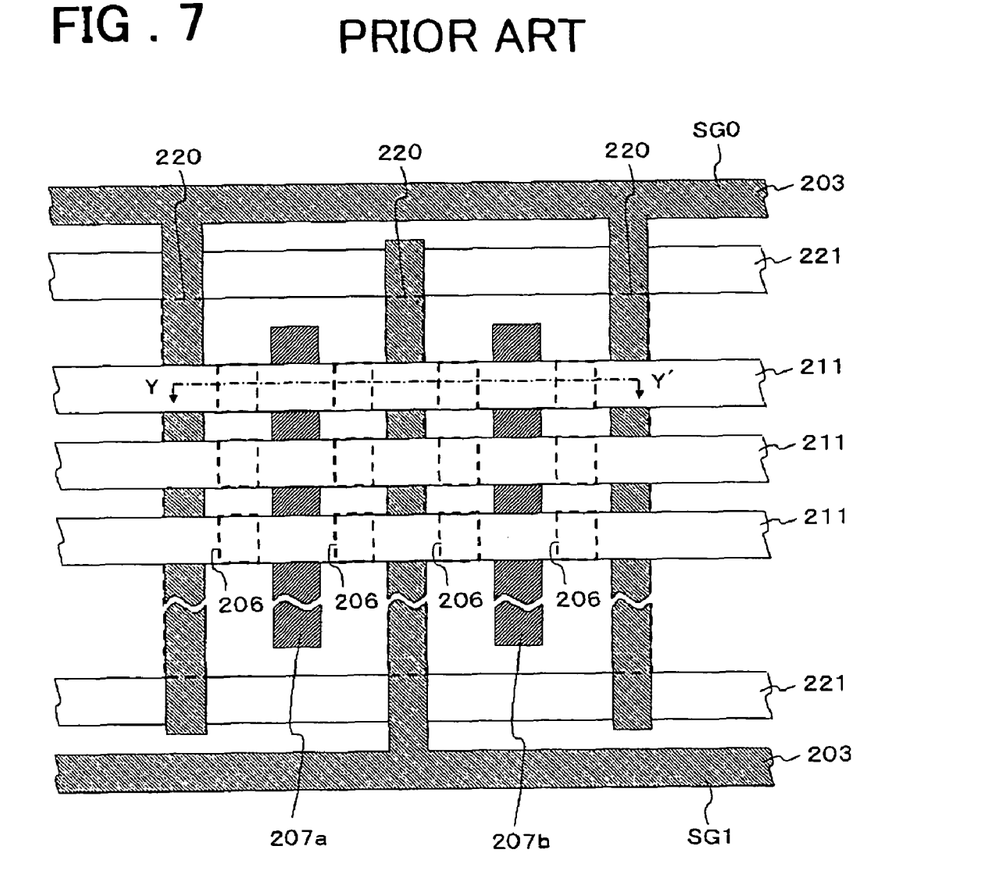
FIG. 7 is a partial top view schematically showing the configuration of a semiconductor storage device in prior art 2.
Figure 8:
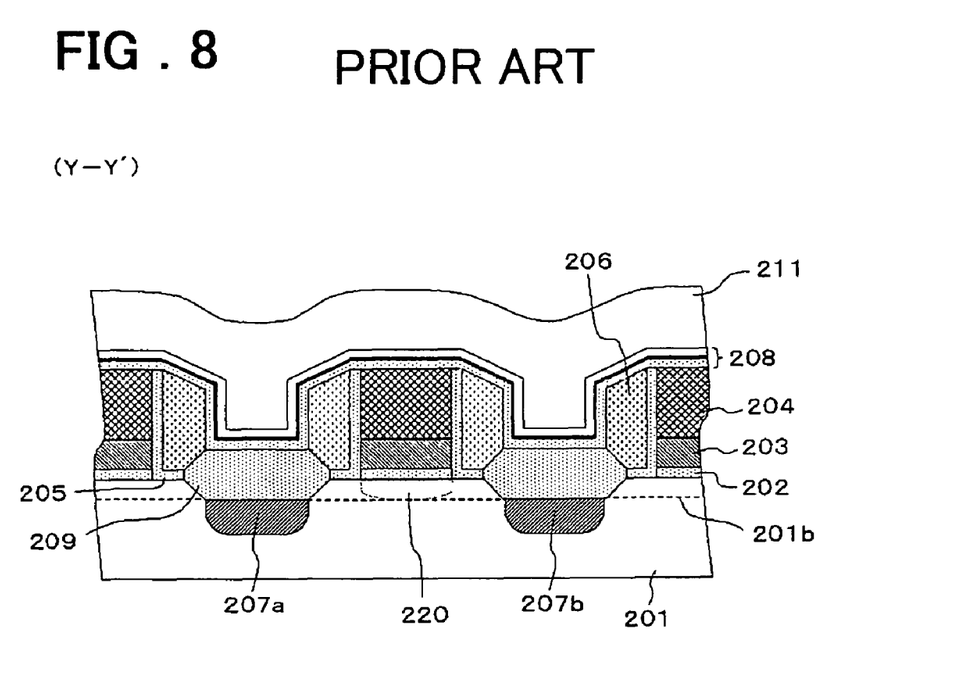
FIG. 8 is a partial cross section view schematically showing the configuration of the semiconductor storage device in prior art 2 taken along line Y-Y' (in FIG. 7).
Figure 9:
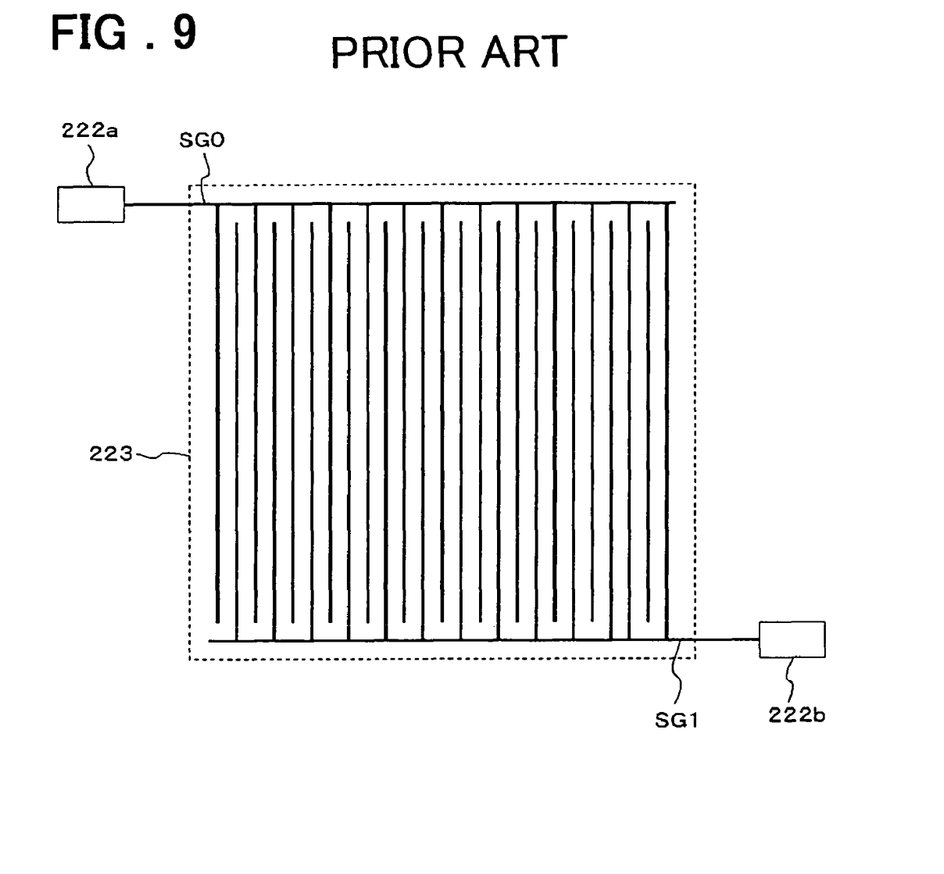
FIG. 9 is a partial top view schematically showing the configuration of select gates in the erase block of the semiconductor storage device in prior art 2.

A nonvolatile semiconductor device such as the one shown in FIG. 7 and FIG. 8 is known as one of conventional semiconductor storage devices (prior art 2). A nonvolatile semiconductor storage device according to prior art 2, used in a memory cell, comprises a first diffused region 207a and a second diffused region 207b spaced in parallel on the surface of a substrate 201; a select gate 203 provided on the substrate 201 in the region between the first diffused region 207a and the second diffused region 207b via an insulator film 202; and a third diffused region (221 in FIG. 7) provided on the surface of the substrate 201 and under the select gate 203 outside the cell region and extending in the direction intersecting the select gate 203. In a first region between the first diffused region 207a and the select gate 203 and a second region between the second diffused region 207b and the select gate 203, the nonvolatile semiconductor storage device further comprises a floating gate 206 provided via the insulator film 202; and a control gate 211 provided on the floating gate 206 and the select gate 203 via an insulator film 208. The first diffused region 207a, the floating gate 206, the control gate 211, and the select gate 203 configure a first unit cell, and the second diffused region 207b, the floating gate 206, the control gate 211, and the select gate 203 configure a second unit cell. The select gate 203 has a pair of SG0 and SG1 in one erase block 223 (see FIG. 9). When viewed from the direction of the normal line to the plane, each of SG0 and SG1 has a comb-like shape with the comb teeth of SG0 arranged in the gaps between the comb teeth of SG1 at a predetermined spacing. SG0 and SG1 are electrically connected to all unit cells in the erase block 223. The erase block, composed of multiple unit cells, is a block composed of all unit cells from which electrons are extracted from the floating gate 206 at the same time when the erase operation is performed (the erase operation will be described later). SG0 is electrically connected to a select gate driving circuit 222a, and SG1 is electrically connected to a select gate driving circuit 222b. In the nonvolatile semiconductor storage device according to prior art 2, a positive voltage is applied to the select gate 203 to form an inversion layer 220 on the surface of the substrate 201 below the select gate 203 in the cell region. The nonvolatile semiconductor storage device according to art 2 differs from the nonvolatile semiconductor storage device according to prior art 1 in that (1) there is the select gate 203, (2) the inversion layer 220 is formed below the select gate 203 in the cell region when a positive voltage is applied to the select gate 203, (3) and the region below the floating gate 206 is used as a channel.

Figure 10:
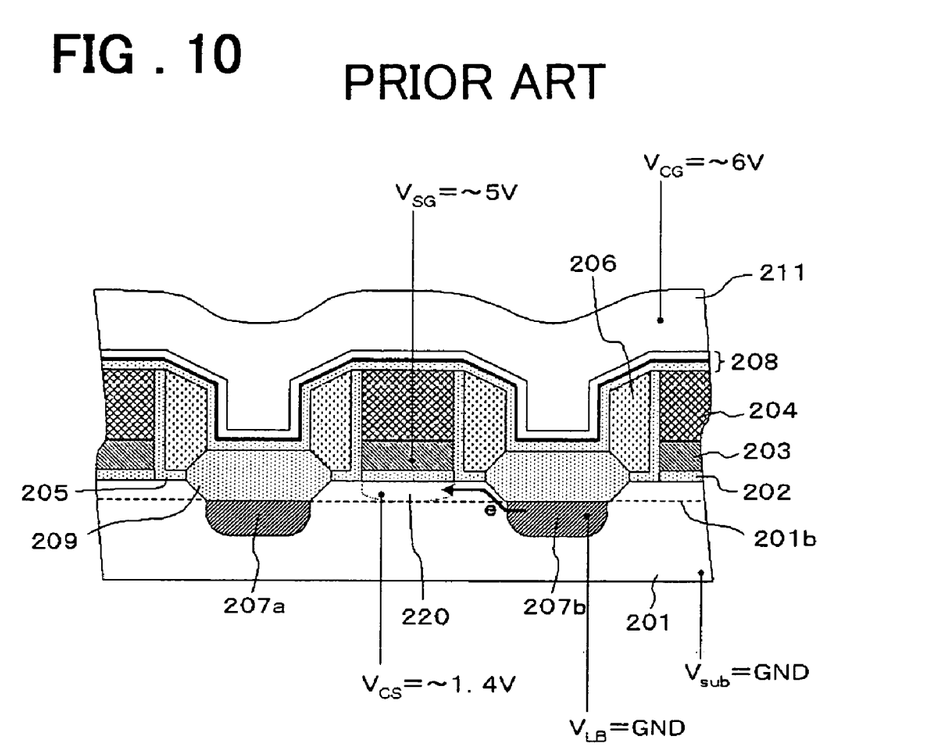
FIG. 10 is a diagram schematically showing the read operation (read operation when electrons are not accumulated in the floating gate) of the semiconductor storage device in prior art 2.
Figure 11:
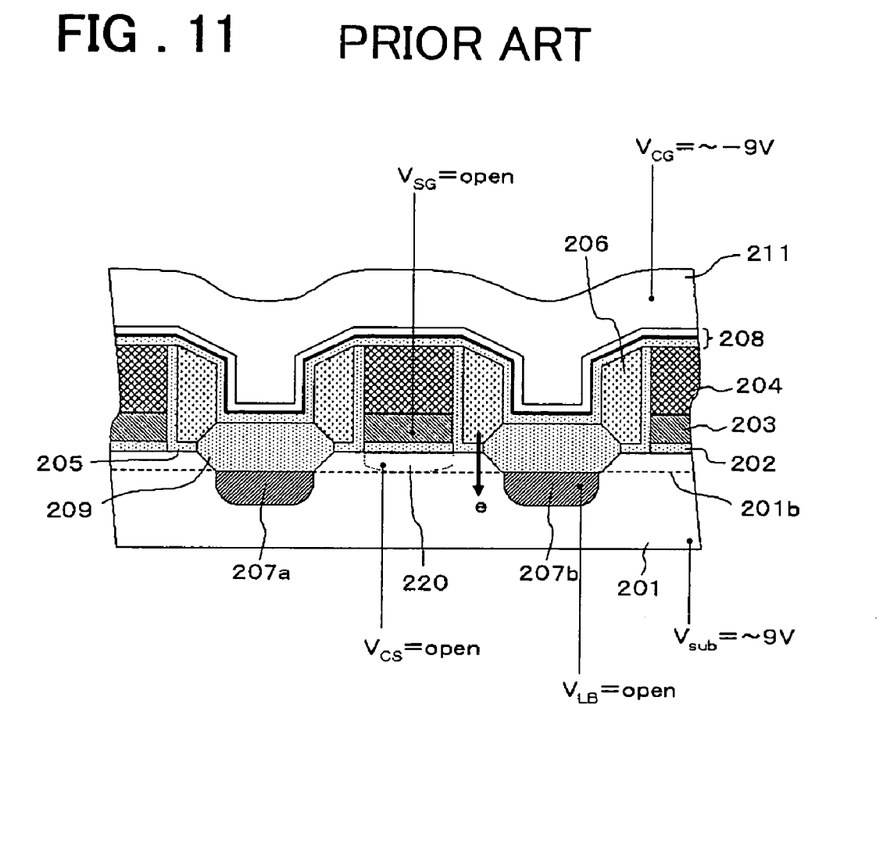
FIG. 11 is a diagram schematically showing the erase operation of the semiconductor storage device in prior art 2.

The following describes the operation of the nonvolatile semiconductor storage device according to prior art 2 with reference to the drawings. FIG. 10 is a schematic diagram showing the read operation (read operation when electrons are not accumulated in the floating gate) of the semiconductor storage device according to prior art 2. FIG. 11 is a schematic diagram showing the erase operation of the semiconductor storage device according to prior art 2.

Referring to FIG. 10, when electrons are not accumulated in the floating gate 206 (erase state: low threshold voltage) during the read operation, applying a positive voltage to the control gate 211, the select gate 203, and the third diffused region (221 in FIG. 7) causes electrons e in the second diffused region 207b to flow through the channel immediately below the floating gate 206 and through the inversion layer 220 formed below the select gate 203 and to move into the third diffused region (221 in FIG. 7). On the other hand, when electrons are accumulated in the floating gate 206 (write state: high threshold voltage), electrons e do not flow even if a positive voltage is applied to the control gate 211, the select gate 203, and the third diffused region (221 in FIG. 7) because there is no channel below the floating gate 206 (not shown). The read operation is performed by determining the data (0/1) indicating whether or not electrons e flow.

Referring to FIG. 11, applying a negative high voltage to all control gates 211 running through the erase block (223 in FIG. 9) and applying a positive high voltage to the substrate 201 during the erase operation cause the electrons e to be extracted from the floating gate 206 into the substrate 201 via an insulator film 205 (tunnel oxide film) below the floating gate 206 and, as a result, all unit cells in the erase block are erased. Although not shown, it is also possible that data is erased by applying a negative high voltage to the control gate 211 and by applying a positive voltage to the select gate 203 to extract the electrons e from the floating gate 206 into the select gate 203 via the tunnel oxide film 205 on the wall of the floating gate 206.

As compared with the nonvolatile semiconductor storage device according to prior art 1, the nonvolatile semiconductor storage device according to prior art 2 has a configuration in which data is read with the channel of the select gate 203 as the drain. In this configuration, data is read from a target storage node of a first independent unit cell, which is opposed to a non-target storage node across the select gate 203, not via the non-target storage node of a second unit cell. The nonvolatile semiconductor storage device with this configuration, which functions virtually as one bit cell, is advantageous in providing a reliable circuit operation.

[Patent Document 1]

Japanese Patent No. 3249811

SUMMARY OF THE DISCLOSURE

The disclosure of the above Patent Document 1 is herein incorporated by reference thereto.

However, in the nonvolatile semiconductor storage device according to prior art 2, there is a possibility that data cannot be read speedily because the select gate in the erase block, which includes multiple memory cells, is divided only into two. That is, in the nonvolatile semiconductor storage device according to prior art 2, the length of the select gate 203 (for example, polysilicon) tends to be long with the result that the resistance of the select gate 203 of a cell distant from the select gate driving circuit tends to be high. In addition, the select gate 203 (polysilicon) tends to be large with the result that the parasitic capacitance of the select gate 203 tends to be high. The high parasitic capacitance and the high resistance of the cell gate 203 require a long time to reach the potential required for cell selection, thus preventing data from being read speedily.

In view of the foregoing, it is an object of the present invention to increase the read speed.

In a first aspect of the present invention, a nonvolatile semiconductor storage device having one cell is provided in which the cell comprises a select gate provided in a first region on a substrate via a first insulator film; a floating gate provided in a second region adjacent to the first region via a second insulator film; a diffused region adjacent to the second region and provided in a third region on a surface of the substrate; and a control gate provided on the floating gate via a third insulator film. The select gate is divided into three or more in an erase block composed of all unit cells, from each of which electrons are extracted from the floating gate, at the same time when an erase operation is performed. Each of the select gates, created by the division, is formed in a comb-like shape in which, when viewed from a direction of a normal line to a plane, a plurality of comb teeth extend from a common line, and the comb teeth of a first select gate created by the division are arranged in gaps between the comb teeth of an adjacent second select gate at a predetermined spacing.

In the nonvolatile semiconductor storage device in accordance with the present invention, it is preferable that the comb teeth of the first select gate and the second select gate, provided at both ends of the select gates created by the division, extend to only one side in a direction orthogonal to the common line and the comb teeth of a third select gate provided between the first select gate and the second select gate extend to both sides in a direction orthogonal to the common line.

In the nonvolatile semiconductor storage device in accordance with the present invention, it is preferable that the select gate is divided into four or more in the erase block, each of the select gates, created by the division, is formed in a comb-like shape in which, when viewed from the direction of the normal line to the plane, a plurality of comb teeth extend from the common line, and the comb teeth of each of the select gates, created by the division, extend to only one side in a direction orthogonal to the common line.

In a second aspect of the present invention, a nonvolatile semiconductor storage device having an erase block composed of a plurality of unit cells is provided in which the unit cell comprises a select gate provided in a first region on a substrate via a first insulator film; a storage node provided in a second region adjacent to the first region via a second insulator film; a diffused region adjacent to the second region and provided in a third region on a surface of the substrate; and a control gate provided on the storage node via a third insulator film. The select gate is divided into a plurality of pieces so that the erase block is further divided into a plurality of pieces, and each of the select gates, created by the division, is driven by a select gate driving circuit specified for the select gate.

In the nonvolatile semiconductor storage device in accordance with the present invention, it is preferable that the erase block is divided into three or more pieces.

In the nonvolatile semiconductor storage device in accordance with the present invention, it is preferable that time constants of select gate wires driven by the select gate driving circuits are approximately equal.

The meritorious effects of the present invention are summarized as follows.

In accordance with the present invention (first and second aspects), data can be read speedily. That is, because the select gate is shorter than that of the conventional nonvolatile semiconductor storage device, the resistance of the select gate distant from the select gate driving circuit is reduced. In addition, because the area of the select gate is smaller than that of the conventional nonvolatile semiconductor storage device, the parasitic capacitance of the select gate is reduced. A lower parasitic capacitance and a lower resistance of the select gate reduce the time to reach the potential required for cell selection, thus enabling data to be read speedily.

In accordance with the present invention, because the length and the area can be made uniform among the select gates created by the division, the time to reach the potential required for the select gates can be made constant. This allows data to be read quickly from any cell regardless of whichever cell is selected.

PREFERRED EMBODIMENTS OF THE INVENTION

First Embodiment

Figure 1:
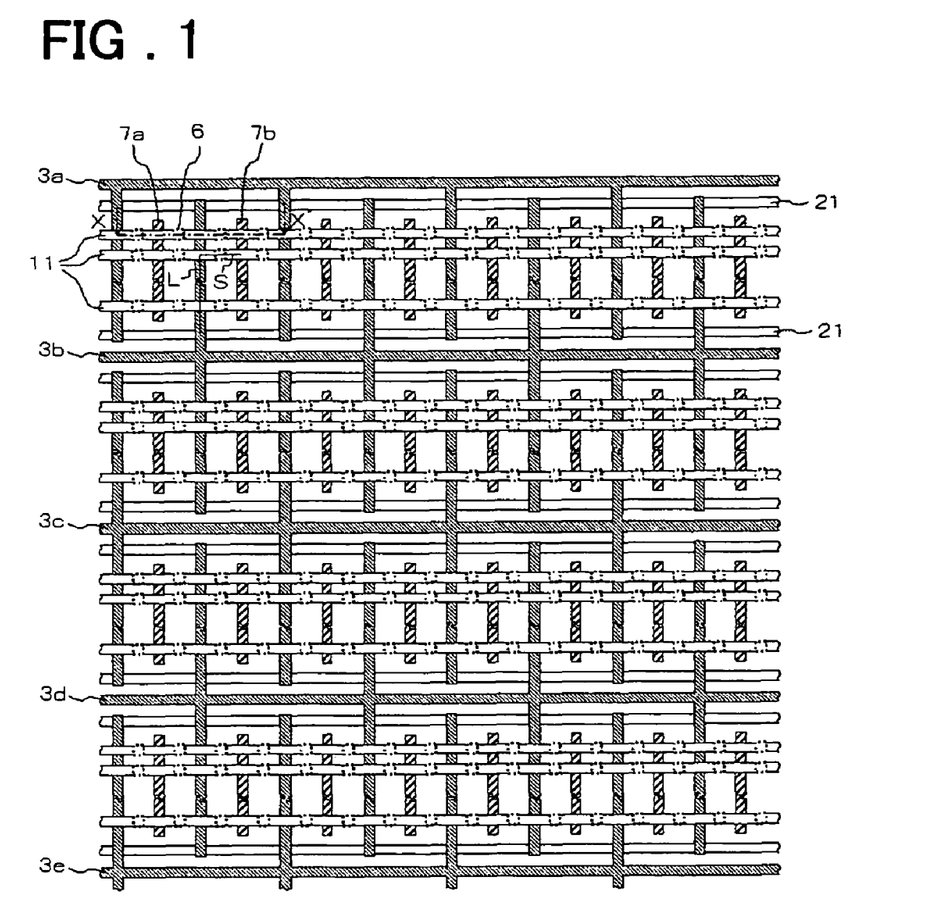
FIG. 1 is a partial top view schematically showing the configuration of a semiconductor storage device in a first embodiment of the present invention.
Figure 2:
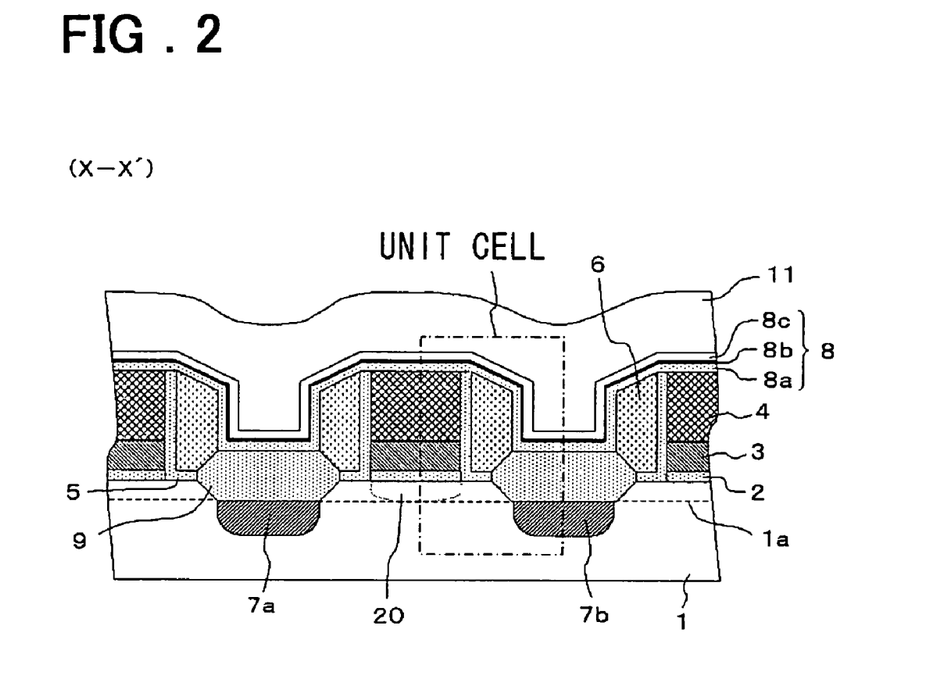
FIG. 2 is a partial cross section view schematically showing the configuration of the semiconductor storage device in the first embodiment of the present invention (taken along line X-X' in FIG. 1).
Figure 3:
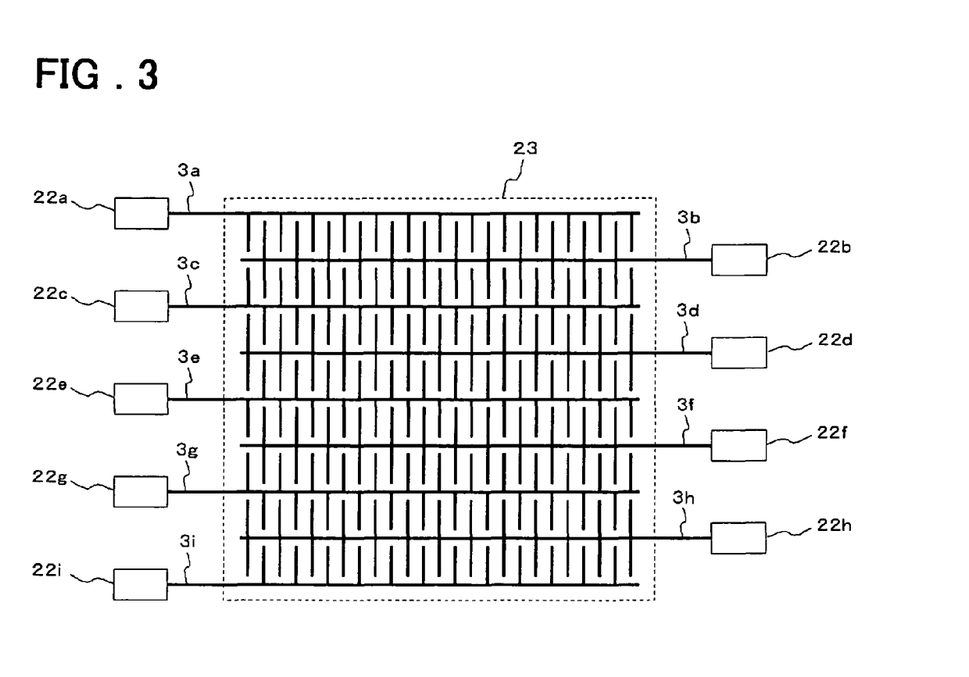
FIG. 3 is a partial top view schematically showing the configuration of select gates in the erase block of the semiconductor storage device in the first embodiment of the present invention.

A nonvolatile semiconductor storage device in a first embodiment of the present invention will be described with reference to the drawings. FIG. 1 is a partial top view schematically showing the configuration of the semiconductor storage device in the first embodiment of the present invention. FIG. 2 is a partial cross section view schematically showing the configuration of the semiconductor storage device in the first embodiment of the present invention (taken along line X-X' in FIG. 1). FIG. 3 is a partial top view schematically showing the configuration of select gates in the erase block of the semiconductor storage device in the first embodiment of the present invention.

The semiconductor storage device is a nonvolatile semiconductor storage device in which two-bit information is stored in one cell. The semiconductor storage device comprises a substrate 1, an insulator film 2, a select gate 3, an insulator film 4, an insulator film 5, a floating gate 6, a first diffused region 7a, a second diffused region 7b, an insulator film 8, an insulator film 9, a control gate 11, and a third diffused region (21 in FIG. 1). As indicated by the chain line in FIG. 2, one unit cell in the semiconductor storage device comprises one second diffused region 7b, one floating gate 6, the control gate 11, and the select gate 3. A two-bit cell in the semiconductor storage device is configured by arranging two unit cells axisymmetrically with one select gate 3 as a common select gate. That is, referring to FIG. 2, the other unit cell of the two-bit cell comprises one first diffused region 7a, one floating gate 6, the control gate 11, and the select gate 3.

The substrate 1 is a P-type silicon substrate. The substrate 1 has a well 1a below the select gate 3 and the floating gate 6. The well 1a is a p-type diffused region. The well 1a is also called a common source diffused region.

Referring to FIG. 1, a channel that is a route connecting between the second diffused region 7b and the third diffused region 21 has two paths, a first path L and a second path S, when the substrate 1 is viewed from top. The first path L extends from one third diffused regions 21 side along one direction defined based on the two-dimensional shape of the select gate 3 (3b). The remote end of the first path L extended (apart) from one third diffused regions 21 side is bent to the second path S. The second path S extends to the side of the other second diffused region 7b along the second direction that is at a predetermined angle (for example, right angle) to the first direction. The channel below the select gate 3 (3b) in the cell region of the first path L becomes an inversion layer when a positive voltage is applied to the select gate 3. For the second path S, even the region below the floating gate 6 is used as the channel region (see FIGS. 1 and 2). Similarly, the channel region that is a route connecting between the first diffused region 7a and the third diffused region 21 has two paths, a first path and a second path, when the substrate 1 is viewed from top. The first path extends from one third diffused region 21 side along the longitudinal direction of the select gate 3. The end of the first path is bent. The second path extends to the first diffused region 7a side along the second direction that is at a predetermined angle (for example, right angle) to the first direction.

The insulator film 2 is provided between the select gate 3 and the substrate 1 (see FIG. 2). For example, a silicon oxide film can be used as the insulator film 2. The insulator film 2 is also called a select gate insulator film.

The select gate 3 is a conductive film provided on the insulator film 2 (see FIG. 2). For example, the select gate 3 may be made of polysilicon. The select gate 3 is divided into three or more in one erase block 23 (divided into two in prior art 2). For example, the select gate 3 is divided into nine in FIG. 3: 3a, 3b, 3c, 3d, 3e, 3f, 3g, 3h, and 3i. The select gate 3 may be divided into multiple pieces to allow the erase block 23 to be further divided. When viewed from the direction of the normal line to the plane, the select gate 3a is formed in a comb-like shape in which multiple comb teeth extend from the common line (horizontal line in FIG. 3) toward the bottom of FIG. 3. When viewed from the direction of the normal line to the plane, the select gates 3b, 3c, 3d, 3e, 3f, 3g, and 3h are each formed in a comb-like shape in which multiple comb teeth extend from the common line toward both the top and the bottom of FIG. 3. When viewed from the direction of the normal line to the plane, the select gate 3i is formed in a comb-like shape in which multiple comb teeth extend from the common line toward the top of FIG. 3. The comb teeth of the select gate 3b are collinear with the comb teeth of the corresponding select gates 3d, 3f, and 3h. The comb teeth of the select gates 3c, 3e, and 3g are collinear with the comb teeth of the corresponding select gates 3a and 3i. The comb teeth of the select gate 3b are arranged in the gaps between the comb teeth of the select gates 3a and 3c at a predetermined spacing (so that the teeth of one select gate are between the teeth of the other). The comb teeth of the select gate 3d are arranged in the gaps between the comb teeth of the select gates 3c and 3e at a predetermined spacing so that the teeth of one select gate are between the teeth of the other. The comb teeth of the select gate 3f are arranged in the gaps between the comb teeth of the select gates 3e and 3g at a predetermined spacing (so that the teeth of one select gate are between the teeth of the other). The comb teeth of the select gate 3h are arranged in the gaps between the comb teeth of the select gates 3g and 3i at a predetermined spacing (so that the teeth of one select gate are between the teeth of the other). The select gates 3a, 3b, 3c, 3d, 3e, 3f, 3g, 3h, and 3i are electrically connected to a part of the unit cells in the erase block 23. The erase block 23, composed of multiple unit cells, is a block of the unit cells from which electrons are extracted from the floating gates 6 at the same time when the erase operation is performed. The select gates 3a, 3b, 3c, 3d, 3e, 3f, 3g, 3h, and 3i are electrically connected, specified for one to one, to select gate driving circuits 22a, 22b, 22c, 22d, 22e, 22f, 22g, 22h, and 22i, respectively.

The insulator film 4 is provided on the select gate 3 (see FIG. 2).

The insulator film 5 is provided on the sidewall of the insulator film 4, on the sidewall of the select gate 3, on the sidewall of the insulator film 2, and between the substrate 1 and the floating gate 6. For example, the insulator film 5 is a silicon oxide film (see FIG. 2). The insulator film 5 is also called a tunnel oxide film.

The floating gate 6 is a storage node that is provided, via the insulator film 5, on both sides of the select gate structure composed of a lamination layer of the select gate 3 and the insulator film 4 (see FIG. 2). The floating gate 6 is made, for example, of polysilicon. The floating gate 6 is sidewall-shaped when viewing from the cross section (see FIG. 2), and is island-shaped when viewed from the top (see FIG. 1).

The first diffused region 7a and the second diffused region 7b are each an $n^+$-type diffused region provided in a predetermined region (between the neighboring floating gates 6) on the substrate 1 and extending in the direction in which (the comb teeth of) the select gate 3 extends (see FIGS. 1 and 2). The first diffused region 7a and the second diffused region 7b, which work with the select gate 3, are drain regions of the cell transistor when data is written and are source regions when data is read. The first diffused region 7a and the second diffused region 7b are also called local bit lines. The impurity density of the first diffused region 7a and that of the second diffused region 7b are the same.

The insulator film 8 is an insulator film provided between the floating gate 6 and the control gate 11 (see FIG. 2). For example, an ONO film, composed of a silicon oxide film 8a, a silicon nitriding film 8b, and a silicon oxide film 8c, can be used for the insulator film 8. This film is highly insulative, has a high specific inductance, and is suitable for thin film fabrication.

The insulator film 9 is an insulator film provided between the silicon oxide film 8a and (the first diffused region 7a and the second diffused region 7b of) the substrate 1 (see FIG. 2). The insulator film 9 is made, for example, of a silicon oxide film (thermally-oxidized film) formed through thermal oxidation or a silicon oxide film formed by the CVD method.

The control gate 11, which extends in the direction orthogonal to the longitudinal direction of the select gate 3, and the select gate 3 (3a, 3b, 3c, 3d, and 3e) cross each other three-dimensionally (FIG. 1). The control gate 11 abuts on the top surface of the silicon oxide film 8c provided in the upper layer of the select gate 3 in the intersection with the select gate 3 (see FIG. 2). The control gate 11 is provided on both sides of the select gate structure, composed of a lamination layer of the select gate 3 and the insulator film 4, via the insulator film 5, the floating gate 6, and the insulator film 8 (see FIG. 2). The control gate 11 is made of a conductive film, for example, polysilicon. A high-melting-point metallic silicide (not shown) may be provided on the surface of the control gate 11 to reduce the resistance. The control gate 11 is used as a word line.

The third diffused region 21, an n$^+$-type diffused region, is the source/drain region of the cell transistor (see FIG. 1). The third diffused region 21 extends into the direction orthogonal to the longitudinal direction of the select gate 3 outside the cell region and intersects the select gate 3 three-dimensionally. The third diffused region 21 is formed in the top layer of the substrate 1 directly below the insulator film 2 in the bottom layer of the select gate 3 at the intersection with the select gate 3 (not shown).

The cross section (partial cross section diagram in FIG. 2) of a 2-bit cell in the nonvolatile semiconductor storage device in the first embodiment is similar in structure to the cross section (partial cross section diagram in FIG. 8) of a 2-bit cell in the nonvolatile semiconductor storage device in prior art 2. The method for fabricating the nonvolatile semiconductor storage device in the first embodiment (from the formation of the well 1a to the formation of the control gate 11) is the same as that for fabricating the nonvolatile semiconductor storage device in prior art 2 with the exception that the two-dimensional patterns of the components are different.

Next, the following describes the operation of the semiconductor storage device in the first embodiment of the present invention.

To read data, for example, from the select gate 3a which is one of the select gates 3a, 3b, 3c, 3d, 3e, 3f, 3g, 3h, and 3i, a positive voltage is applied only from the select gate driving circuit 22a, electrically connected to the select gate 3a of the cell from which data is to be read, to the select gate 3a, and the voltage 0V is applied to the select gates other than the select gate 3a (that is, select gates 3b, 3c, 3d, 3e, 3f, 3g, 3h, and 3i) (see FIG. 3). A positive voltage is applied also to the control gate 11 and the third diffused region 21 of the cell from which data is to be read (see FIGS. 1 and 2). It is also possible that the voltage is applied only to the cell from which data is to be read in the same way the voltage is applied during the read operation of the semiconductor storage device in prior art 2 (see FIG. 10). For example, the voltage $V_{CG}$=6V is applied to the control gate 11, the voltage $V_{SG}$=5V is applied to the select gate 3 (corresponds to the select gate 3a in FIG. 3), the voltage $V_{CS}$=1.4V is applied to the third diffused region 21 (embedded diffused layer) that is used as the drain side, and the ground potential (GND=0V) is applied to the second diffused region 7b (local bit line) that is the source side and to the substrate 1. When electrons are not accumulated in the floating gate 6 (erase state: low threshold voltage), the voltages, if applied as described above, cause the electrons e to flow from the second diffused region 7b, through the channel region directly below and near the sidewall of the floating gate 6 and through the inversion layer formed below the select gate 3, to the third diffused region (21 in FIG. 1). On the other hand, when electrons are accumulated in the floating gate 6 (write state; high threshold voltage), the electrons e do not flow because there is no channel below the floating gate 6 (not shown). The data (0/1) is checked by determining whether or not the electrons flow.

To erase data, a negative high voltage is applied to all control gates 11 in the erase block (23 in FIG. 3) and a positive high voltage is applied to the substrate 1. In this respect, the erase operation is the same as that of the semiconductor storage device in prior art 2 (see FIG. 11). Although not shown, the erase operation is also performed by applying a high negative voltage to all control gates 11 in the erase block (23 in FIG. 3) and by applying a positive voltage to predetermined select gates 3 (for example, 3b, 3d, 3f, and 3h in FIG. 3) in the erase block (23 in FIG. 3).

Data can be read speedily from the nonvolatile semiconductor storage device in the first embodiment. That is, because the select gate 3 (for example, polysilicon) is shorter than that of the conventional nonvolatile semiconductor storage device, the resistance of the select gate 3 distant from the select gate driving circuit is reduced. In addition, because the area of the select gate 3 is smaller than that of the conventional nonvolatile semiconductor storage device, the parasitic capacitance of the select gate 3 is reduced. A lower parasitic capacitance and a lower resistance of the select gate 3 reduce the time to reach the potential required for cell selection, thus enabling data to be read speedily.

Second Embodiment

Figure 4:
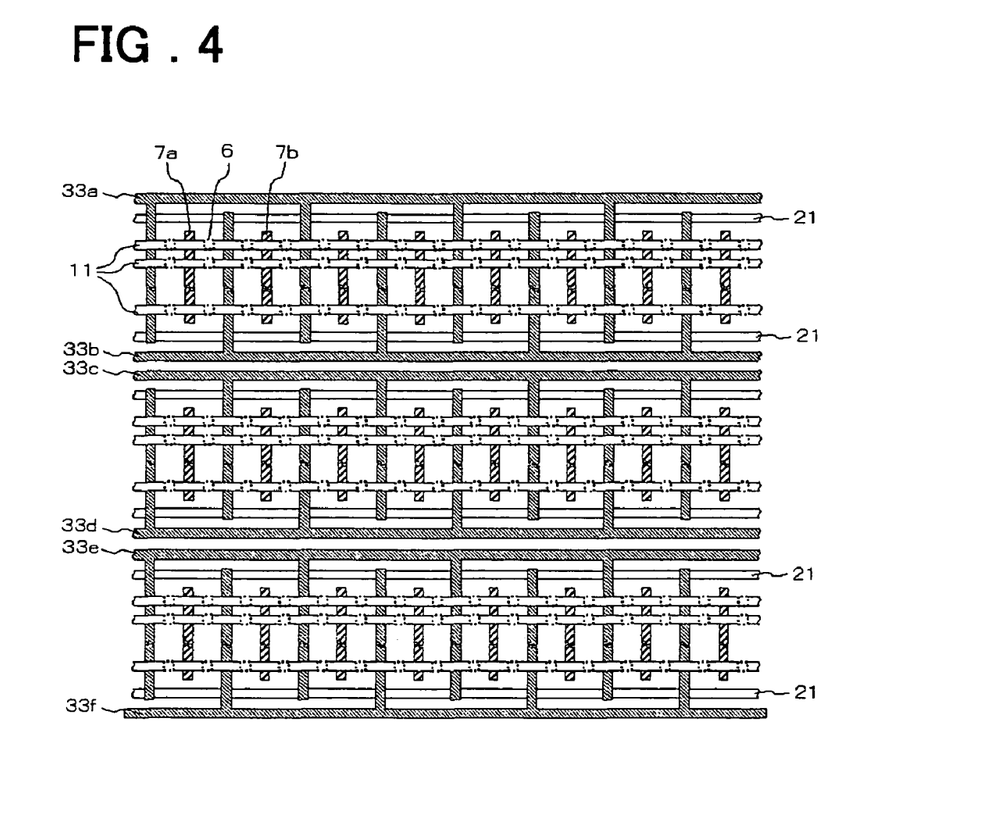
FIG. 4 is a partial top view schematically showing the configuration of a semiconductor storage device in a second embodiment of the present invention.
Figure 5:
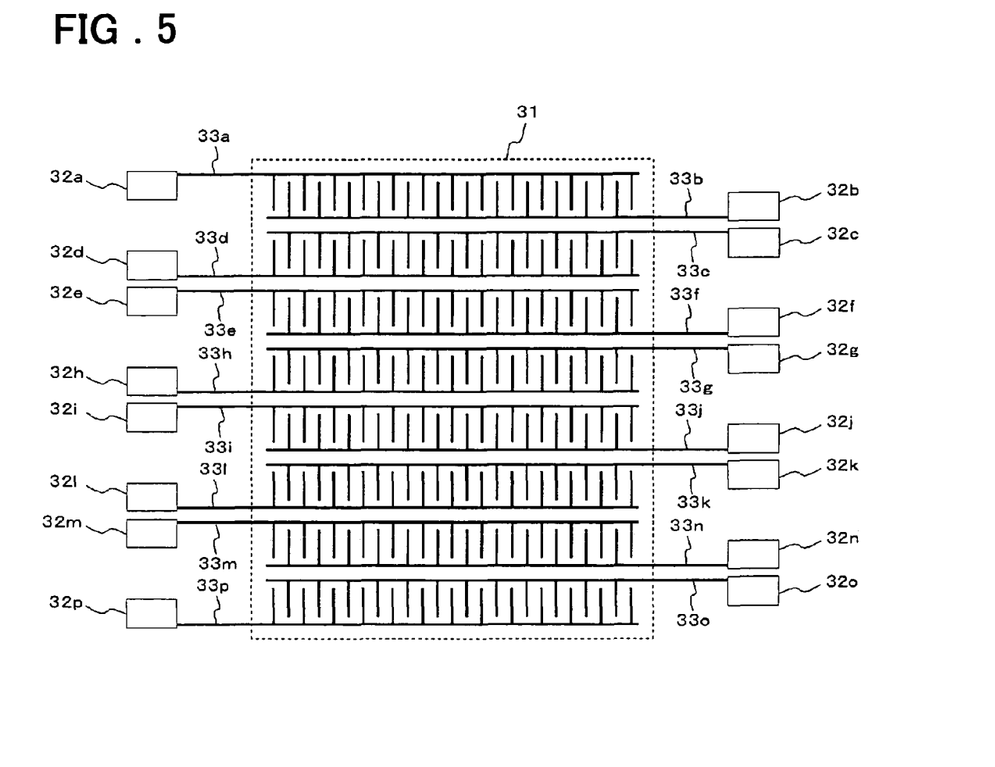
FIG. 5 is a partial top view schematically showing the configuration of select gates in the erase block of the semiconductor storage device in the second embodiment of the present invention.

A nonvolatile semiconductor storage device in a second embodiment of the present invention will be described below with reference to the drawings. FIG. 4 is a partial top view schematically showing the configuration of the semiconductor storage device in the second embodiment of the present invention. FIG. 5 is a partial top view schematically showing the configuration of the select gates in the erase block of the semiconductor storage device in the second embodiment of the present invention.

The configuration of the nonvolatile semiconductor storage device in the second embodiment differs from that of the nonvolatile semiconductor storage device in the first embodiment in the two-dimensional pattern of select gates 33a-33p in an erase block 31 and in the number of select gate driving circuits 32a-32p. The other configuration is the same as that of the nonvolatile semiconductor storage device in the first embodiment. The cross section of the two-bit cell of the nonvolatile semiconductor storage device in the second embodiment is the same as the cross section of the two-bit cell of the nonvolatile semiconductor storage device (see FIG. 2) in the first embodiment.

The select gate 33 is divided into four or more in one erase block 31 (Note: divided into two in prior art 2). For example, the select gate 33 is divided into 16, 33a-33p, in FIG. 5. When viewed from the direction of the normal line to the plane, the select gates 33a, 33c, 33e, 33g, 33i, 33k, 33m, and 33o are each formed in a comb-like shape in which multiple comb teeth extend from the common line (horizontal line in FIG. 5) toward the bottom of FIG. 5. When viewed from the direction of the normal line to the plane, the select gates 33b, 33d, 33f, 33h, 33j, 33l, 33n, and 33p are each formed in a comb-like shape in which multiple comb teeth extend from the common line (horizontal line in FIG. 5) toward the top of FIG. 5. The comb teeth of the select gate 33a are collinear (registered on the same linear line) with the comb teeth of the corresponding select gates 33d, 33e, 33h, 33i, 33l, 33m, and 33p. The comb teeth of the select gate 33b are collinear with the comb teeth of the corresponding select gates 33c, 33f, 33g, 33j, 33k, 33n, and 33o. The comb teeth of the select gate 33a are arranged in the gaps between the comb teeth of the select gates 33b at a predetermined spacing (so that the teeth of one select gate are between the teeth of the other), and the select gate 33a and the select gate 33b form a pair. Similarly, each of 33c and 33d, 33e and 33f, 33g and 33h, 33i and 33j, 33k and 33l, 33m and 33n, and 33o and 33p forms a pair. The select gates 33a-33p are electrically connected to a part of the unit cells in the erase block 31. The select gates 33a-33p are electrically connected respectively (by one to specified one) to the select gate driving circuits 32a-32p (by one to specified one). The time constants of the wiring of the select gates 33a-33p, which are driven by the select gate driving circuits 32a-32p, are approximately equal.

The second embodiment has the same effect as the first embodiment. In addition, because the length and the area can be made unique among the select gates 33a-33p, the time to reach the potential required for the select gates 33a-33p can be made constant and, therefore, data can be read quickly from any cell regardless of whichever cell is selected.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A nonvolatile semiconductor storage device comprising a plurality of cells organized within one or more erase block units, each cell comprising:
    a select gate provided in a first region on a substrate via a first insulator film;
    a floating gate provided in a second region adjacent to said first region via a second insulator film;
    a diffused region adjacent to said second region and provided in a third region on a surface of said substrate; and
    a control gate provided on said floating gate via a third insulator film,
    wherein all cells within an erase block unit can be selectively erased as a unit by applying a first voltage to the select gates located within said erase block and a second voltage applied to the control gates of said erase block unit, so that electrons are extracted from floating gates of said cells when an erase operation is performed,
    wherein select gates in an erase block unit are formed in a plurality of comb-like shapes in which, when viewed from a direction of a normal line to a plane, a plurality of comb teeth extend from a common line of the comb-like shape,
    wherein the comb teeth of a first select gate comb-like shape are arranged in gaps between the comb teeth of a second select gate comb-like shape at a predetermined spacing, and
    wherein the comb teeth of the first select gate comb-like shape extend to both sides of the common line of the first select gate comb-like shape and the comb teeth of the second select gate comb-like shape extend to both sides of the common line of the second select gate comb-like shape, in a direction orthogonal to the common line.

2. The nonvolatile semiconductor storage device as defined in claim 1, further comprising at least one comb-like shape having comb teeth extending to only one side in a direction orthogonal to the common line.

3. The nonvolatile semiconductor storage device of claim 1, further comprising a driver connection for each said select gate comb-like structure.

* * * * *